(12) United States Patent
Hung et al.

(10) Patent No.: US 10,546,757 B2
(45) Date of Patent: Jan. 28, 2020

(54) DEVICE AND METHOD FOR CONTROLLING INTRO-DIE VARIATION

(71) Applicant: Taiwan Semiconductor Manufacturing Co., Ltd., Hsinchu (TW)

(72) Inventors: Cheng-Hsiung Hung, Hsinchu (TW); Po-Shu Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/987,706

(22) Filed: May 23, 2018

(65) Prior Publication Data

US 2019/0362986 A1 Nov. 28, 2019

(51) Int. Cl.
| | | |
|---|---|---|
| *H01L 21/3213* | (2006.01) | |
| *H01L 21/3205* | (2006.01) | |
| *H01L 29/06* | (2006.01) | |
| *H01L 21/762* | (2006.01) | |
| *H01L 21/321* | (2006.01) | |

(52) U.S. Cl.
CPC ...... *H01L 21/32133* (2013.01); *H01L 21/321* (2013.01); *H01L 21/32055* (2013.01); *H01L 21/76224* (2013.01); *H01L 29/0649* (2013.01)

(58) Field of Classification Search
CPC ......... H01L 21/32133; H01L 21/32055; H01L 21/321; H01L 21/76224; H01L 29/0649
USPC ... 257/506, 531, E21.004, E21.19, E21.409, 257/E21.552, E27.111; 438/197, 275, 438/382, 439, 585
See application file for complete search history.

(56) References Cited

U.S. PATENT DOCUMENTS

| | | | | |
|---|---|---|---|---|
| 10,147,692 | B2 * | 12/2018 | Chen | H01L 24/05 |
| 2002/0097367 | A1 * | 7/2002 | Hirabayashi | G02F 1/136277 |
| | | | | 349/149 |
| 2010/0159670 | A1 * | 6/2010 | Kobayashi | H01L 21/76202 |
| | | | | 438/439 |
| 2013/0309834 | A1 * | 11/2013 | Hsieh | H01L 27/0629 |
| | | | | 438/382 |
| 2015/0249145 | A1 * | 9/2015 | Yoshimori | H01L 29/66545 |
| | | | | 438/275 |
| 2017/0110202 | A1 * | 4/2017 | Wu | H01L 28/00 |

* cited by examiner

*Primary Examiner* — Dao H Nguyen
(74) *Attorney, Agent, or Firm* — Duane Morris LLP

(57) ABSTRACT

Disclosed is a method for fabricating a semiconductor device with intra-die variation control. In one embodiment, a method for fabricating a semiconductor device includes: depositing a first dielectric layer on a semiconductor substrate die; patterning a conductive layer on the first dielectric layer to create at least one device region and at least one dummy pattern region, wherein the at least one device region comprises a plurality of first conductive patterns and the at least one dummy pattern region comprises a plurality of second conductive patterns to control intra-die variation.

20 Claims, 9 Drawing Sheets

DEVICE AND METHOD FOR CONTROLLING INTRO-DIE VARIATION

BACKGROUND

Intra-die variation contributes to the loss of matched behavior between structures on the same chip. Controlling over the intra-die variation has been an important element for the successful manufacture of integrated circuits (IC). Generally, a major source of an intra-die variation can be wafer-level position dependent. For example, a wafer scale variation can result in trends that are reflected across the spatial range of the chips, e.g., a concentric ring pattern in thickness from the center of the wafer outwards. Another major source of an intra-die variation can be die-pattern dependent. For example, intra-die variation can be caused by a photolithography process (e.g., variations in a mask, distortion in lens of an exposure system, loading uniformity in an etching system, etc.). For another example, a variation of film thickness caused by a nonuniformity in a deposition system and/or a chemical-mechanical planarization (CMP) process could also contribute to the intra-die variation. These variations in physical dimensions of devices on the same chip could result in a variation in performance, such as variations in leakage current, threshold voltage, resistance, and delay within devices on the same chip.

Particularly, resistance variation in conductive patterns (e.g., polycrystalline silicon gate) caused by the intra-die variation may result in differences in supply voltages on gates, affect temperature profile caused by heating, and increase uncertainty in timing (e.g., inaccuracy in delay). Therefore, a resistance variation of conductive patterns needs to be minimized. Besides the aforementioned process variations which can contribute to this effect, processes that have short time scales, e.g., rapid thermal annealing (RTA) process widely used for annealing materials at a high ramp rate and for a short period of time, can also contribute to the resistance variation. Since the length scale over which thermal equilibrium can be reached for a given time is a function of thermal conductivity and specific heat of materials, device structure and layout pattern design therefore have great impact to the local thermal equilibrium. For example, the resistance variation of doped polycrystalline silicon patterns on the same chip has a correlation with the pattern density (i.e., area of polycrystalline silicon patter per unit area), which is primarily due to the difference of reflectance of incident RTA lamp spectrum. Despite this long felt need to control the RTA induced intra-die resistance variation, no suitable methods are available.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of method and device for controlling intra-die resistance variation in conductive patterns (e.g., polycrystalline silicon) using a modified pattern layout design during the pattern step for creating the conductive patterns. In some embodiment, a dummy pattern layout region is added outside the device layout region on the same mask. As such, during the polycrystalline silicon deposition process, dummy polycrystalline silicon patterns are created outside the device region, which is used to tune the thermal reflectivity at positions near the boundaries of the device region and reduce the resistance variation of device patterns in the device region especially near the boundaries. Accordingly, the above-mentioned issue may be advantageously avoided.

Figure 1:
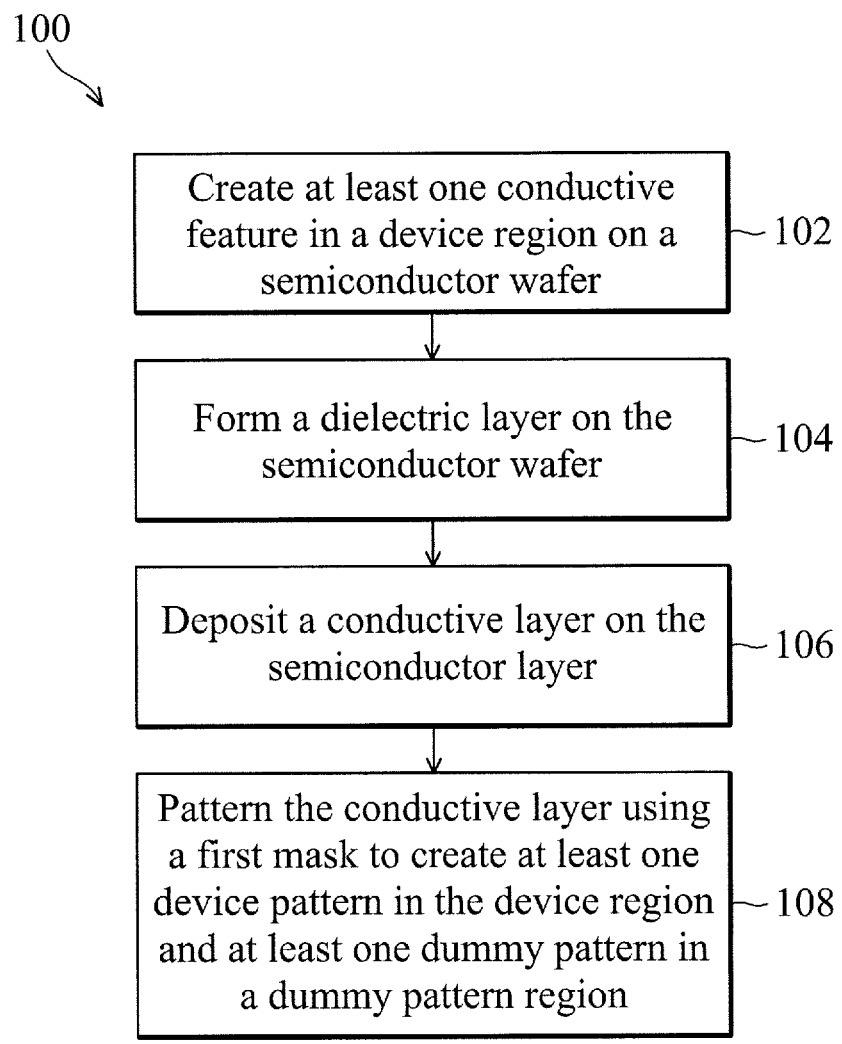
FIG. 1 illustrates a flowchart of a method to form a semiconductor device with intra-die variation control, in accordance with some embodiments of the present disclosure.

FIG. 1 illustrates a flowchart of a method 100 to form a semiconductor device with intra-die variation control, in accordance with some embodiments of the present disclosure. It is noted that the method 100 is merely an example, and is not intended to limit the present disclosure. Accordingly, it is understood that additional operations may be provided before, during, and after the method 100 of FIG. 1, and that some other operations may only be briefly described herein. In some embodiments, operations of the method 100 may be associated with cross-sectional views of a semiconductor device at various fabrication stages as shown in FIGS. 2A, 2B, 2C, 2D, 2E, 2F, 2G, 2H, 2I, and 2J, respectively, which will be discussed in further detail below.

Referring now to FIG. 1, the method 100 starts with operation 102 in which at least one conductive feature (e.g., a source and drain) is created in a device region in a semiconductor wafer. In some embodiments, the semiconductor wafer includes a silicon substrate. Alternatively, the semiconductor wafer may include other elementary semiconductor material such as, for example, germanium. The semiconductor wafer may also include a compound semiconductor such as silicon carbide, gallium arsenic, indium arsenide, and indium phosphide. The semiconductor wafer may include an alloy semiconductor such as silicon germanium, silicon germanium carbide, gallium arsenic phosphide, and gallium indium phosphide. In one embodiment, the semiconductor wafer includes an epitaxial layer. For example, the substrate may have an epitaxial layer overlying a bulk semiconductor. Furthermore, the semiconductor wafer may include a semiconductor-on-insulator (SOI) structure. For example, the substrate may include a buried oxide (BOX) layer formed by a process such as separation by implanted oxygen (SIMOX) or other suitable technique, such as wafer bonding and grinding. In some embodiments, a dielectric layer patterned using a photolithography process is created on the surface of the semiconductor wafer in order to define at least one area on the semiconductor wafer for the conductive feature. In some embodiments, processes to create the at least one conductive feature includes ion implantation and/or diffusion. In some embodiments, shallow trench isolation (STI) structures can be created between conductive features, which comprises patterning with a mask layer (e.g., silicon nitride), etching of the semiconductor wafer, depositing a dielectric layer, and polishing the surface using a chemical-mechanical planarization (CMP) process.

The method 100 continues to operation 104 in which an interfacial dielectric layer is fondled on the semiconductor wafer. In some embodiments, the interfacial dielectric layer can be a silicon oxide from various deposition or growth techniques including, thermal oxidation, spin coating, physical vapor deposition, chemical vapor deposition, etc. In some embodiments, the interfacial dielectric can be various insulating materials, including aluminum oxide ($Al_2O_3$), hafnium oxide ($HfO_2$), Lanthanum oxide ($La_2O_3$), zirconium oxide ($ZrO_2$), beryllium strontium titanium oxide (Ba—Sr—Ti—O), silicon nitride ($Si_3N_4$), and laminate of a mixture thereof.

The method 100 continues with operation 106 in which a conductive layer is deposited on the semiconductor wafer. In some embodiments, the conductive layer comprises conductive materials, e.g., doped-polycrystalline silicon. In some embodiments, the doped-polycrystalline silicon can be deposited using a chemical vapor deposition (CVD) process.

The method 100 continues with operation 108 in which the conductive layer is patterned using a first mask with a first layout to create a plurality of conductive patterns in the device region and a plurality of dummy patterns in a dummy pattern region. In some embodiments, the first layout of the first mask comprises a device layout region designed by customers depending on applications which includes active and functional devices. In the first mask, the dummy pattern region is positioned outside the device layout region, as discussed further in detail below in FIG. 2J. After patterning, conductive patterns are created in a device region and a dummy pattern region on the semiconductor wafer corresponding to the device layout region and the dummy pattern layout region on the first mask, respectively. In some embodiments, the plurality of conductive patterns in the device region and the dummy pattern region comprises the material of the conductive layer. In some embodiments, the plurality of conductive patterns is made of polycrystalline silicon. The plurality of conductive patterns in the dummy pattern region is to provide a balanced conductive material/insulating material ratio so that the intra-die resistance variation of the at least one device patterns in the device region can be reduced.

As mentioned above, FIGS. 2A-2J illustrate, in a cross-sectional view, a portion of a semiconductor device 200 with intra-die variation control at various fabrication stages of the method 100 of FIG. 1. The semiconductor device 200 may be included in a microprocessor, memory cell, and/or other integrated circuit (IC). Also, FIGS. 2A-2J are simplified for a better understanding of the concepts of the present disclosure. Although the figures illustrate the semiconductor device 200, it is understood the device 200 may comprise a number of other devices such as resistors, capacitors, inductors, fuses, etc., which are not shown in FIGS. 2A-2J, for purposes of clarity of illustration.

Figure 2A:
FIGS. 2A-2J illustrate cross-sectional views of the semiconductor device on a substrate with intra-die variation control, in accordance with some embodiments of the present disclosure.

FIG. 2A is a cross-sectional view of the semiconductor device 200 including a substrate 202, in accordance with some embodiments of the present disclosure. In some embodiments, the substrate 202 includes a silicon substrate. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate 202 may have an epitaxial layer overlying a bulk semiconductor. Furthermore, the substrate 202 may include a semiconductor-on-insulator (SOI) structure. For example, the substrate 202 may include a buried oxide (BOX) layer formed by a process such as separation by implanted oxygen (SIMOX) or other suitable technique, such as wafer bonding and grinding.

Figure 2B:
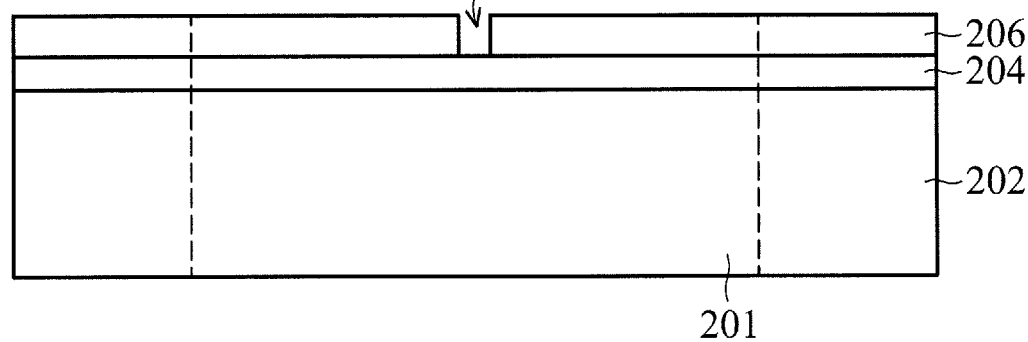

FIG. 2B is a cross-sectional view of the semiconductor device 200 including a deposition and a patterning of a first dielectric layer 204 on the substrate 202 using a first photoresist layer 206 at one of the various stages of fabrication that corresponds to operation 102 of FIG. 1, in accordance with some embodiments of the present disclosure. The first dielectric layer 204 on the substrate 202, in some embodiments, is a silicon nitride (SiN) layer used as a hard mask to create a shallow trench isolation (STI) structure providing isolations to neighboring active devices (e.g., MOS transistors). It should be noted that although only 1 STI structure is shown in FIG. 2B, any number of STI structures is within the scope of this disclosure. In some embodiments, the STI structure is created in a device region 201 on the substrate 202. In some other embodiments, the device region 201 does not comprise a STI structure.

In some embodiments, the first photoresist layer 206 may include a negative or positive tone photoresist layer that is patternable in response to a photolithography light source. In some alternative embodiments, the first photoresist layer 206 may include an e-beam (electron beam) resist layer (e.g., poly methyl methacrylate, methyl methacrylate, etc.) that is patternable in response to an e-beam lithography energy source. In some embodiments, the first photoresist layer 206 is formed over the first dielectric layer 204 using a deposition process known in the art such as spin-coating, spray-coating, dip-coating, roller-coating, or the like. The first photoresist layer 206 is then patterned in a lithography process that may involve various exposure, developing, baking, stripping, etching, and rinsing processes. As a result, the first patterned photoresist layer 206 is formed such that openings 208 exposes at least a portion of the top surface of the first dielectric layer 204, as shown in FIG. 2B.

Figure 2C:
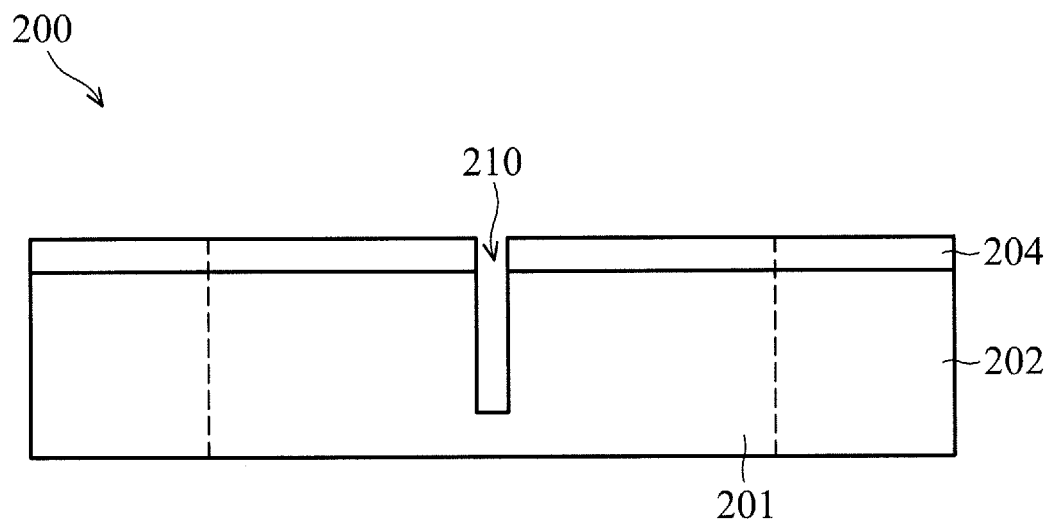

FIG. 2C is a cross-sectional view of the semiconductor device 200 including transferring the opening 208 in the first photoresist layer 206 to the first dielectric layer 204 and etching the substrate 202 using the patterned first dielectric layer 204 as a hard mask at one of the various stages of fabrication that corresponds to operation 102 of FIG. 1, in accordance with some embodiments of the present disclosure. The exposed first dielectric layer 204 at the opening 208 is etched using the first photoresist layer 206 as a mask, in certain embodiments. In some embodiments, the first dielectric layer 204 exposed at the opening 208 of the first photoresist layer 206 is etched using a dry etching process, e.g., a plasma enhanced deep reactive ion etching (DRIE) based on a proper chemistry according to the material of the first dielectric layer 204. In some embodiments, after etching the first dielectric layer 204, the first photoresist layer 206 may be removed by one or more chemical cleaning processes using acetone, 1-Methyl-2-pyrrolidon (NMP), Dimethyl sulfoxide (DMSO), or other suitable removing chemicals. In some embodiments, the chemicals used may need to be heated to temperatures higher than room temperature to effectively dissolve the first patterned photoresist layer 206. The selection of the remover is determined by the type and chemical structure of the first photoresist layer 206, the first dielectric layer 204, as well as the substrate 202 to assure the chemical compatibility of these layers with the chemical cleaning process. In some embodiments, this cleaning process is then followed by a rinsing process using isopropyl alcohol or the like, followed by rinsing using deionized water.

In some embodiments, the exposed substrate 202 after etching the exposed first dielectric layer 204 can be also etched using a dry etching process (e.g., plasma enhanced DRIE). In some embodiments, the dry etching conditions (e.g., pressure, temperature, reactive gas, power, etc.) to remove the material in the substrate 202 is different from the dry etching condition used to remove the material in the first dielectric layer 204. In some embodiments, a trench 210 is created in the substrate 202, as shown in FIG. 2C.

Figure 2D:
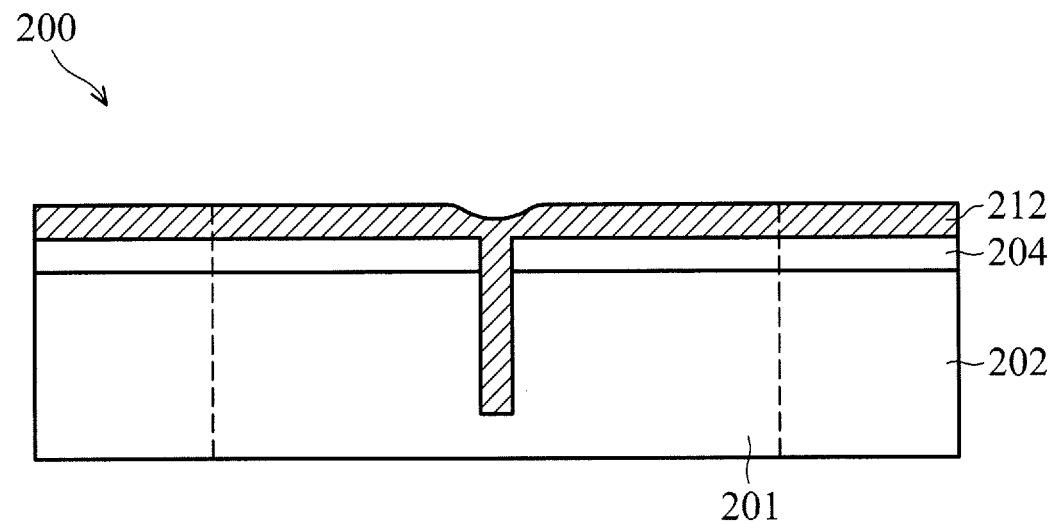

FIG. 2D is a cross-sectional view of the semiconductor device 200 including filling the trench 210 in the substrate 202 with a second dielectric layer 212 at one of the various states of fabrication that corresponds to operation 102 of FIG. 1, in accordance with some embodiments of the present disclosure. In some embodiments, the second dielectric layer 212 includes a material that is at least one of the following materials, including silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

Figure 2E:
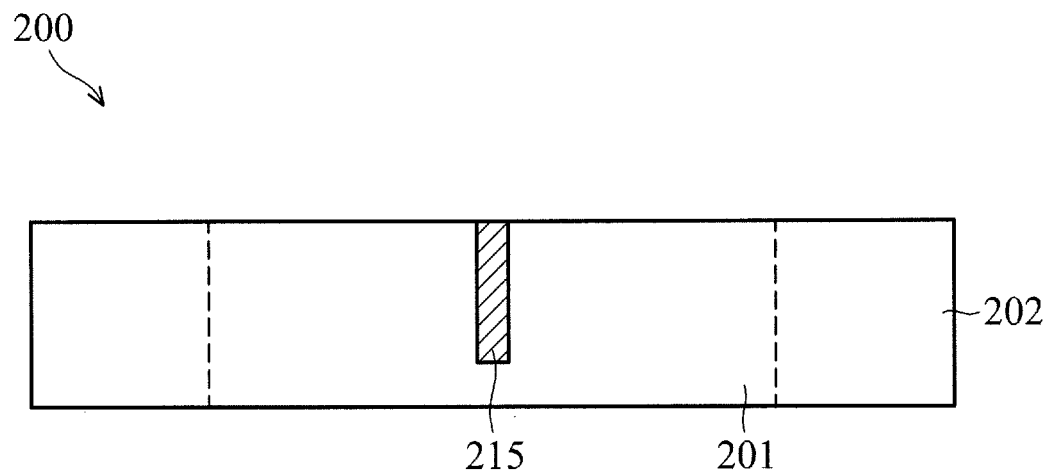

FIG. 2E is a cross-sectional view of the semiconductor device 200 including polishing the second dielectric layer 212 and the first dielectric layer 204 to expose the surface of the substrate 202 at one of the various states of fabrication that corresponds to operation 102 of FIG. 1, in accordance with some embodiments of the present disclosure. In some embodiments, the substrate 202 with the first and the second dielectric layers 204 and 212 is polished using a chemical-mechanical planarization (CMP) process, which is a typical planarization process. CMP utilizes a chemical slurry formulation and mechanical polishing process to remove unwanted conductive or dielectric materials on the substrate, in order to achieve a near-perfect flat and smooth surface. Because of the nature of this cleaning process, a variety of contaminants (e.g., trace metals, mobile ions and organic species) and abrasive materials (e.g., silica and alumina) from the slurry can be introduced to the substrate surface. The substrate 202 with a filled trench 215 is cleaned to remove contaminants and materials from substrate after CMP, and reduce slurry residues to the required minimum level in order to potentially maximize device yields. In some embodiments, the top surface of the filled trench 215 in substrate 202 is coplanar with the top surface of the substrate 202 after polishing, as shown in FIG. 2E. In some embodiments, the filled trench 215 can be used as a shallow trench isolation (STI) to separate various devices formed in the substrate 202.

Figure 2F:
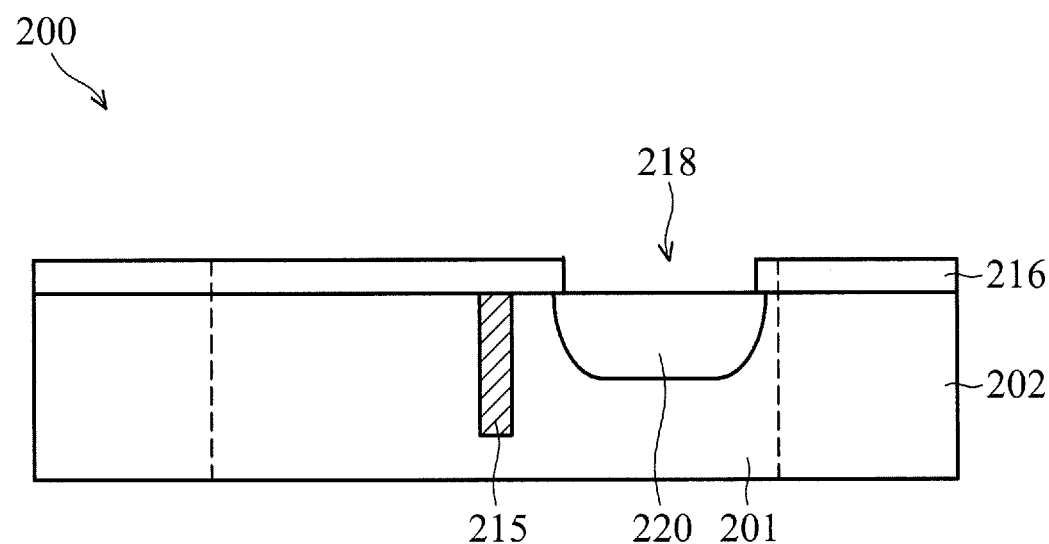

FIG. 2F is a cross-sectional view of the semiconductor device 200 including depositing and patterning a third dielectric layer 216 and creating a first conductive feature 220 at one of the various states of fabrication that corresponds to operation 102 of FIG. 1, in accordance with some embodiments of the present disclosure. In some embodiments, the third dielectric layer 216 includes a material that is at least one of the following materials, including silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

In some embodiments, the patterning of the third dielectric layer 216 to create an opening 218 in the third dielectric layer 216 is performed using a photolithograph process, as discussed in FIG. 2B. In some embodiments, creating the first conductive feature 220 in the substrate 202 at the opening 218 in the third dielectric layer 216 comprises processes such as ion implantation and/or diffusion. In some embodiments, the first conductive feature 220 is a doped region with a different doping concentration from that of the substrate 202. In some embodiments, the first conductive feature 220 can be a p-type doped region or n-type doped regions with various channel doping profiles configured to form various integrated circuit (IC) devices, such as a complimentary metal-oxide-semiconductor field-effect transistor (CMOSFET), imaging sensor, and/or light emitting diode (LED).

Figure 2G:
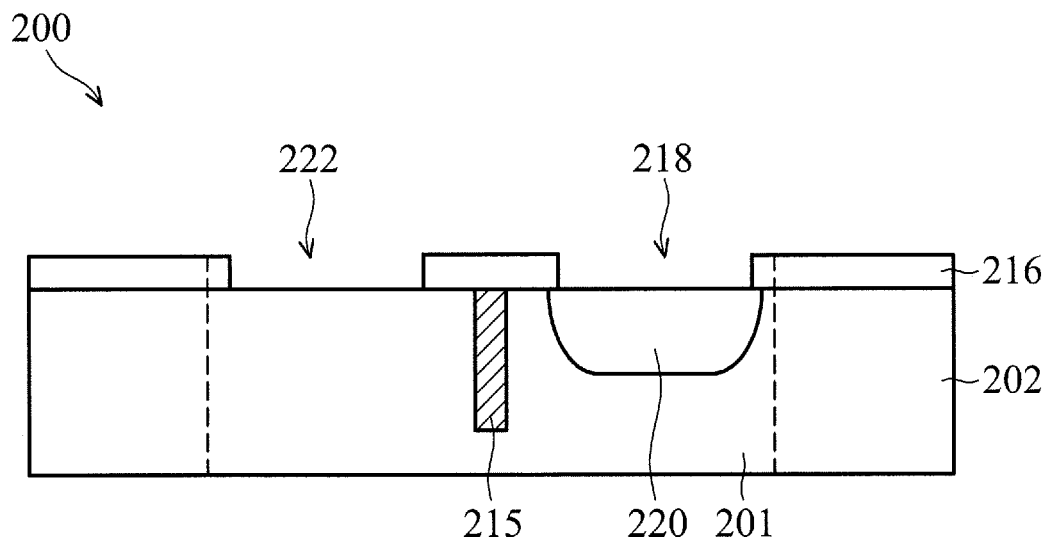

FIG. 2G is a cross-sectional view of the semiconductor device 200 including patterning the third dielectric layer 216 to create an opening 222 at one of the various states of fabrication that corresponds to operation 102 of FIG. 1, in accordance with some embodiments of the present disclosure. In some embodiments, the opening 222 and the opening 218 are separated by the STI structure 215.

Figure 2H:
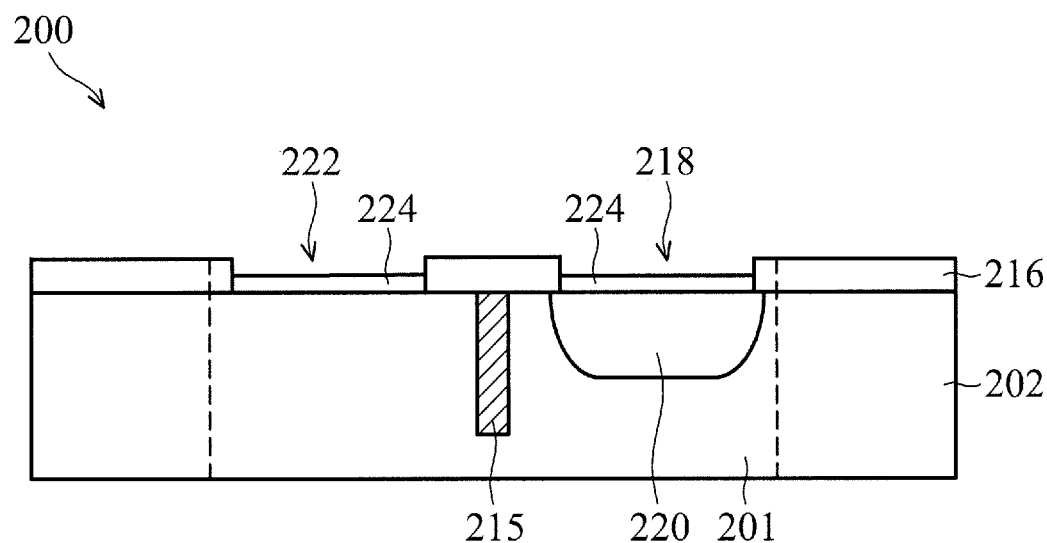

FIG. 2H is a cross-sectional view of the semiconductor device 200 including creating a fourth dielectric layer 224 on the substrate 202 at the openings 218 and 222 at one of the various states of fabrication that corresponds to operation 104 of FIG. 1, in accordance with some embodiments of the present disclosure. In some embodiments, the fourth dielectric layer 224 includes a material that is at least one of the following materials, including silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the fourth dielectric layer 224 is from a thermal oxidation process on the substrate 202.

In some embodiments, materials that can be used the fourth dielectric layer 224 include various insulating materials such as, for example $Al_2O_3$, $HfO_2$, $SiO_2$, $La_2O_3$, $ZrO_3$, Ba—Sr—Ti—O, $Si_3N_4$ and laminate of a mixture thereof. In some embodiments, the fourth dielectric layer 224 comprises a material with a high dielectric constant, e.g., a high-k dielectric material. The fourth dielectric layer 224 can be formed by various processes including deposition of the fourth dielectric layer using PVD, CVD and the like, photolithography and a dry/wet etching process. The thickness of the fourth dielectric layer 224 is controlled by the desired capacitance value, which is a function of the dielectric constant of the dielectric material of the fourth dielectric layer 224 and an operational voltage.

Figure 2I:
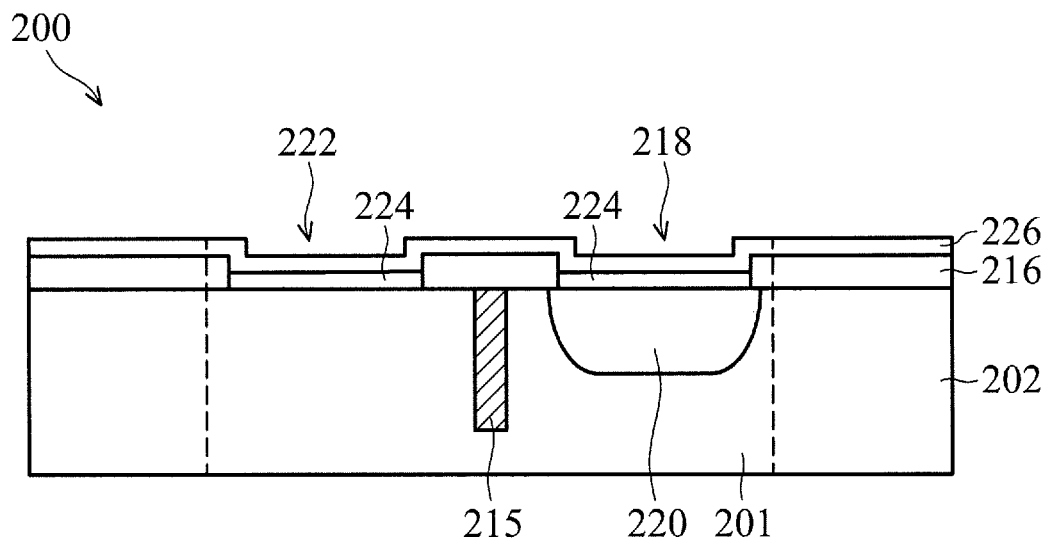

FIG. 2I is a cross-sectional view of the semiconductor device 200 including depositing a conductive layer 226 at one of the various states of fabrication that corresponds to operation 106 of FIG. 1, in accordance with some embodiments of the present disclosure. In some embodiments, the conductive layer 226 can be a polycrystalline Si. In some embodiments, the conductive layer 226 based on polycrystalline Si is deposited using a chemical vapor deposition (CVD) process.

Figure 2J:
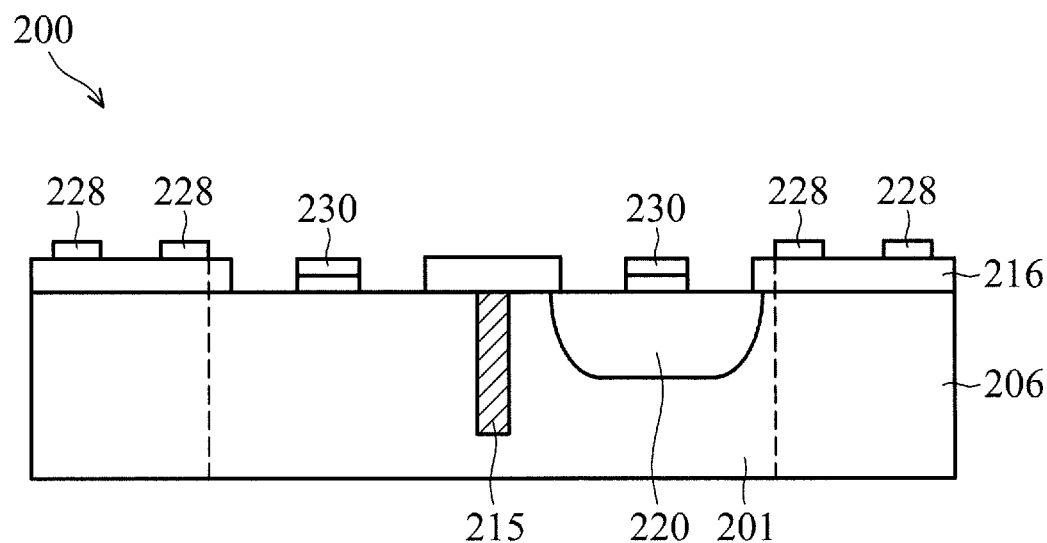

FIG. 2J is a cross-sectional view of the semiconductor device 200 including patterning the conductive layer 226 and the fourth dielectric layer 224 inside the device region 201 and the conductive layer 226 outside the device region 201 at one of the various states of fabrication that corresponds to operation 108 of FIG. 1, in accordance with some embodiments of the present disclosure. In some embodiments, the patterning of the conductive layer 226 and the fourth dielectric layer 224 is performed using a photolithography process as discussed above in FIG. 2B. Accordingly, in some embodiments, a patterned photoresist layer is formed after a conventional patterning (e.g., photolithography) processes, to align with at least part of the third patterned dielectric layer 216 so as to allow one or more later formed conductive patterns to couple with the conductive features in the substrate 202 (e.g., first conductive feature 220).

This photolithography process to create conductive patterns uses a mask in which a dummy pattern layout region is added to the outside of the device layout region. In some embodiments, the dummy pattern layout region comprises a plurality of dummy patterns. The mask with the plurality of dummy patterns results in a plurality of conductive patterns formed outside the device region 201 on the third dielectric layer 216, as shown in FIG. 2J. In some embodiments, the plurality of conductive patterns in the dummy pattern region is made of the material used in the conductive layer 226. In some embodiments, the plurality of conductive patterns is made of polycrystalline silicon. The plurality of conductive patterns in the dummy pattern region 228 is to provide a balanced Si/oxide ratio so that the resistance of polysilicon device patterns 230 inside the device layout region 201 can be uniform across the entire device layout region 201 and aforementioned problem can be avoided. In some embodiments, the plurality of conductive patterns 228 in the dummy pattern region is on the outside of the device region 201 and has the same thickness as the plurality of conductive patterns 230 in the device region 201. In some embodiments, the geometry of the plurality of conductive pattern 228 on the outside of the device region 201 can be determined by the geometry and density of the conductive patterns 230 in the device region 201, which will be further discussed in detail in FIGS. 3A-3C.

In some embodiments, further processes after the operation shown in FIG. 2J can be performed, such as creating heavily doped source or drain regions, annealing the polycrystalline device patterns using rapid thermal annealing (RTA), patterning metal contacts, forming silicides on the source and drain, depositing interlayer dielectric layers, depositing barrier layers, forming vias structures, etc. In some embodiments, a silicide feature disposed on a source, drain or gate electrode typically from a sintering process introduced by at least one of the processes including thermal heating, laser irradiation or ion beam mixing. The silicide feature may be formed on polysilicon gate (typically known as "polycide gate") or by on source/drain (typically known as "salicide") by a self-aligned silicide technique. In some embodiments, a via structure includes a metal material such as, for example, copper (Cu), or the like. In some other embodiments, the via structure may include other suitable metal materials (e.g., gold (Au), cobalt (Co), silver (Ag), etc.) and/or conductive materials (e.g., polysilicon) while remaining within the scope of the present disclosure. In some embodiments, a barrier layer includes a conductive material such as a metal, a metal alloy, or a metal nitride, for example, tantalum nitride (TaN), tantalum (Ta), titanium nitride (TiN), titanium (Ti), cobalt tungsten (CoW), tungsten nitride (WN), or the like. The barrier layer may effectively prevent metal atoms from diffusing into the interlayer dielectric layer during a metal deposition process to form the via structure. These materials can be deposited using techniques, such as chemical vapor deposition (CVD), physical vapor deposition (PVD), spin-on coating, and/or other suitable techniques followed by one or more patterning processes (e.g., a lithography process, a dry/wet etching process, a soft/hard baking process, a cleaning process, etc.), and polishing out excessive materials by a planarization process (e.g., chemical-mechanical polishing).

Although only 2 device patterns 230 and 2 conductive features 220 in the openings 218 and 222, 1 STI structure 215, and 4 dummy patterns 228 are fabricated through the processes, it is understood that the illustrated embodiments of FIGS. 2A-2J, of course, are merely provided for illustration purposes and are not intended to be limiting. Thus, the semiconductor device 200 may include any desired number of conductive patterns 230 in the device region, conductive features 220, STI structures 215 and dummy patterns 228 in the dummy pattern region, while remaining within the scope of the present disclosure. The device region 201 may further include other functional features such as a resistor or a capacitor formed on the substrate 202. Furthermore, the process steps illustrated in FIGS. 2A-2J can be interchangeable. For example, a STI structure 215 can be created after patterning the third dielectric layer 216.

Figure 3A:
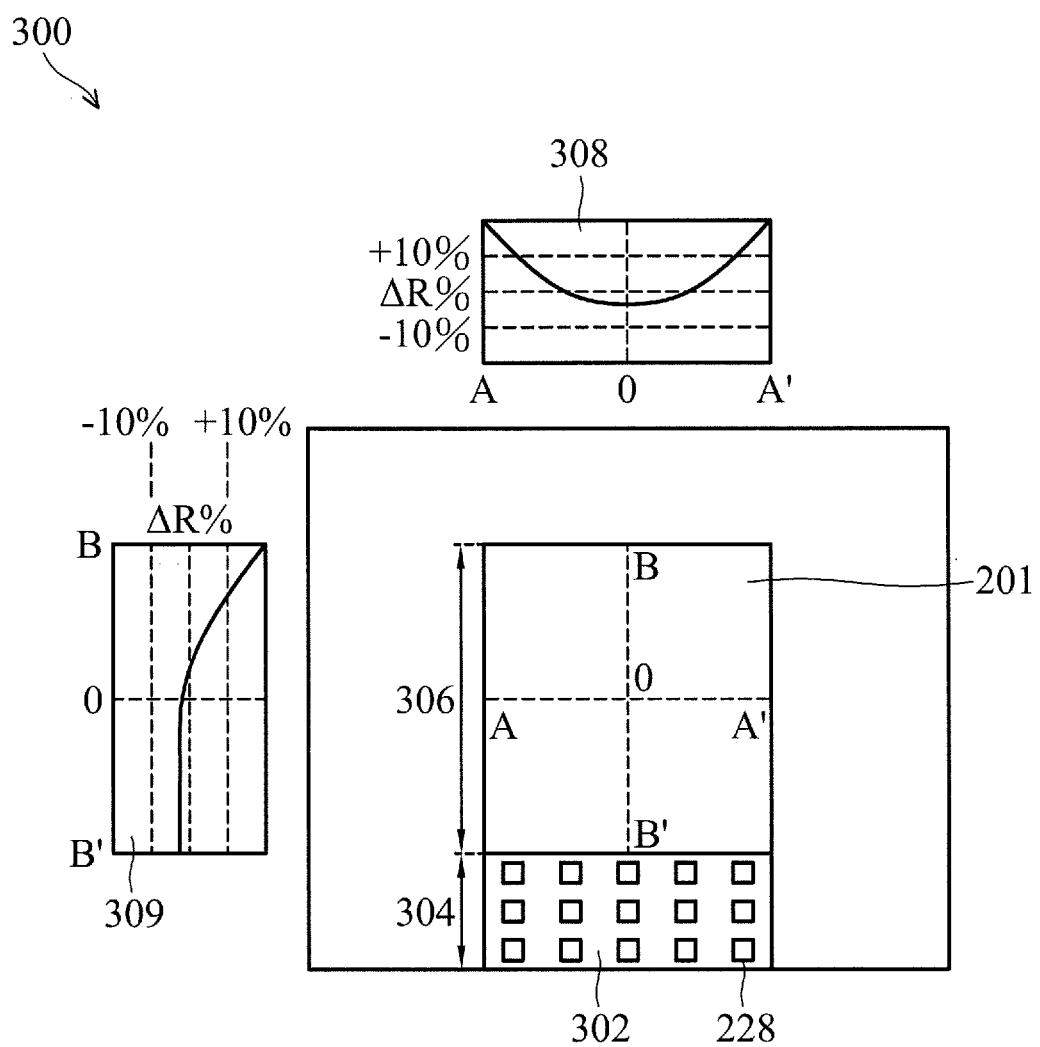
FIG. 3A illustrates an exemplary top view of a semiconductor device with 16 dummy patterns in a dummy pattern region at a lower side of a device region and position-dependent resistance variations of polycrystalline silicon device patterns in the device region along A-A' and B-B' directions, in accordance with some embodiments of the present disclosure.
Figure 3B:
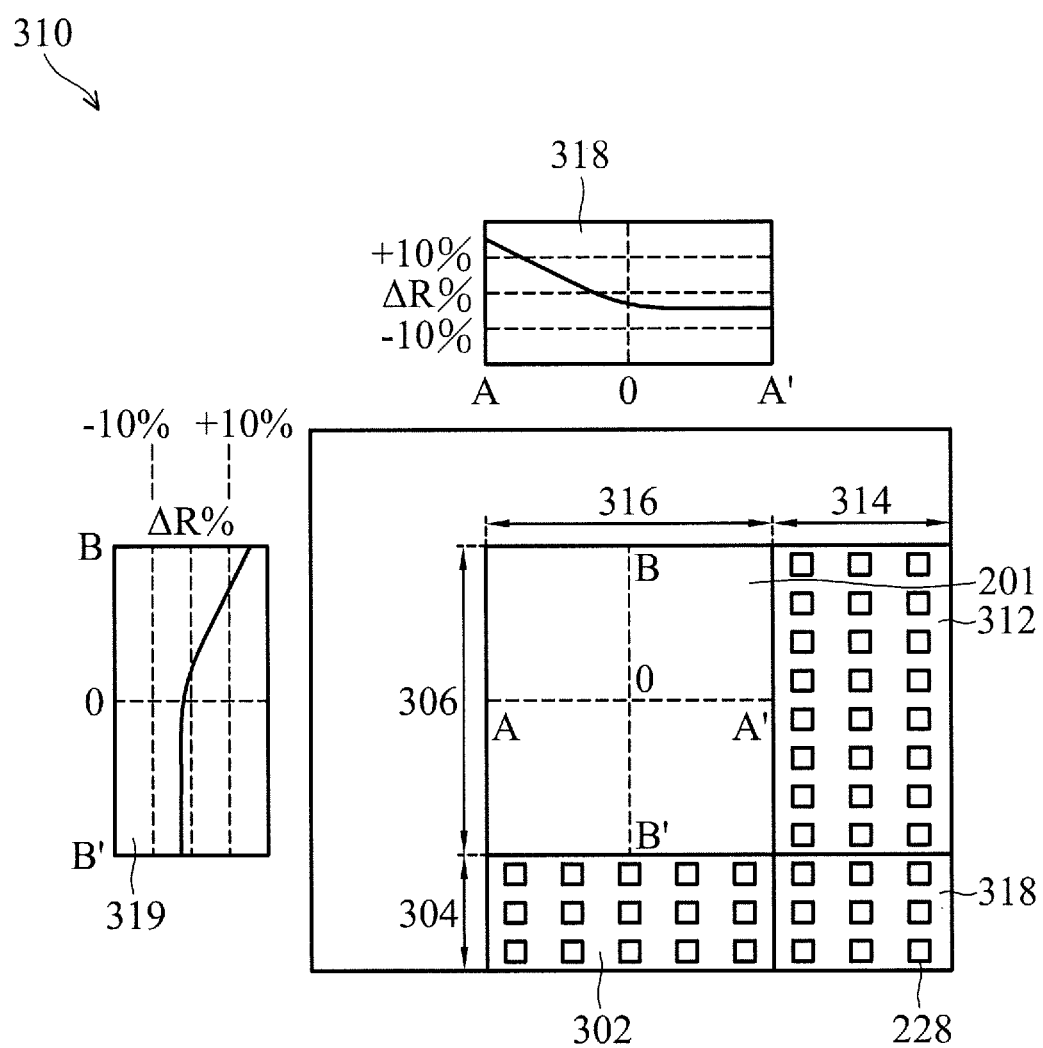
FIG. 3B illustrates an exemplary top view of a semiconductor device with 54 dummy patterns at lower and right side of a device region and position-dependent resistance variations of polycrystalline silicon device patterns in the device region along A-A' and B-B' directions, in accordance with some embodiments of the present disclosure.
Figure 3C:
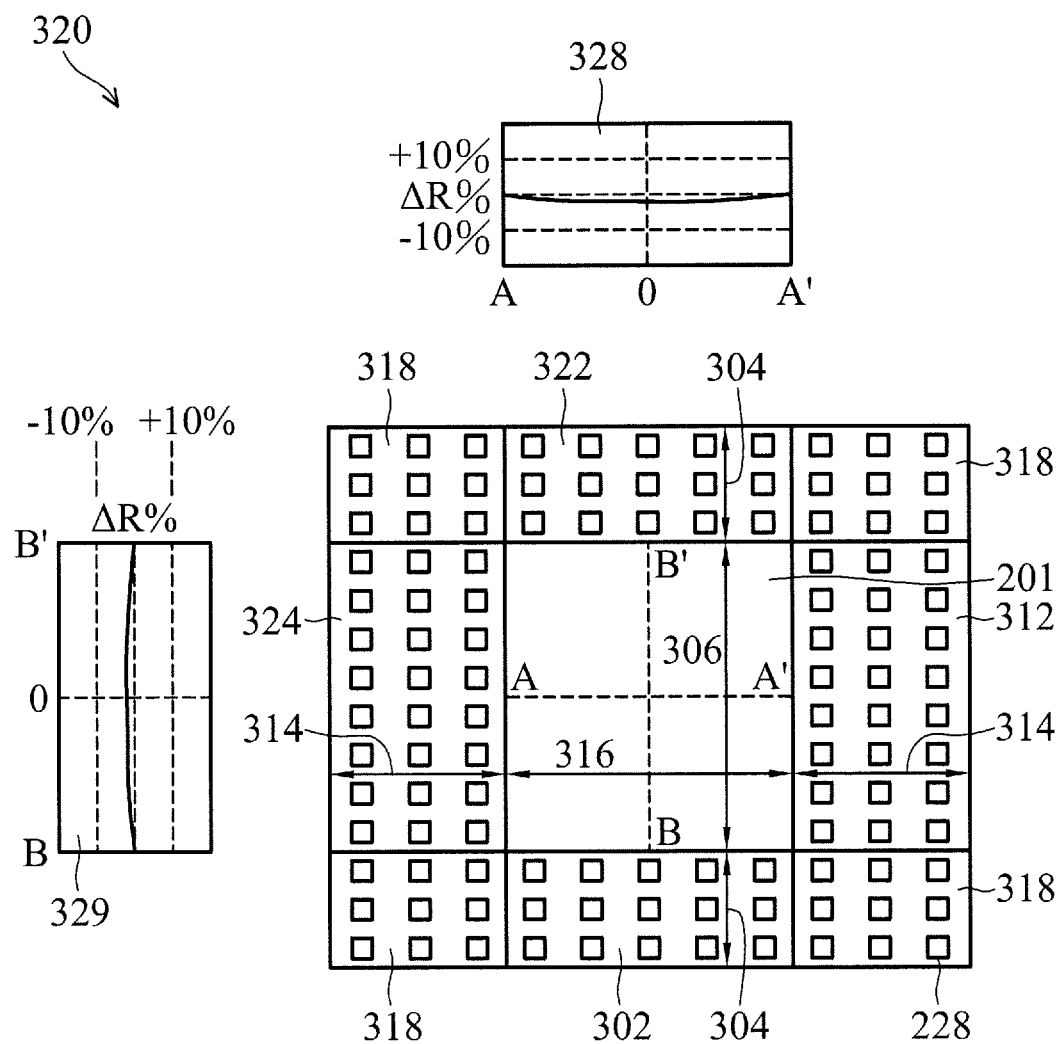
FIG. 3C illustrates an exemplary top view of a semiconductor device with 114 dummy patterns around a device region and position-dependent resistance variations of device patterns in the device region along A-A' and B-B' lines, in accordance with some embodiments of the present disclosure.

FIGS. 3A-3C are exemplary top views of a semiconductor device 300 with a plurality of dummy patterns 228 outside a device region 201, in accordance with some embodiments of the present disclosure. These are, of course, merely examples and are not intended to be limiting. For example, there can be any number of dummy patterns 228 in the dummy pattern region at any position relative to the device region 201.

FIG. 3A illustrates an exemplary top view of a semiconductor device 300 with 16 dummy patterns 228 in a dummy pattern region 302 at a lower side of a device region 201 and position-dependent resistance variations of polycrystalline silicon device patterns 230 in the device region 201 along A-A' and B-B' lines, in accordance with some embodiments of the present disclosure. This is, of course, merely an example and is not intended to be limiting. For example, there can be any number of dummy patterns 228 in the dummy pattern region 302. Furthermore, the dummy pattern region 302 can be at either the higher, lower, right or left side of the device region 201. In some embodiments, the device region 201 comprises active devices and functional devices (not shown), e.g., transistors, capacitors and resistors, on or in a substrate 202 using fabrication processes discussed in FIGS. 2A-2J. In some embodiments, these active or functional devices comprises polycrystalline silicon device patterns 230. In some embodiments, the 16 dummy patterns 228 in the dummy pattern region 302 comprise polycrystalline silicon are patterned on top of an oxide layer 216, as shown in the cross-sectional view FIG. 2J.

In the illustrated embodiment, lines A-A' and B-B' are center lines crossing each other at the center of the device region 201. In some embodiments, the 16 dummy patterns 228 are uniformly distributed in the dummy pattern region 302. The dummy pattern region 302 has a width 304, which is equal to or greater than ½ of a width 306 of the device region 201, according to certain embodiments. In some embodiments, a ratio between the total area covered by the dummy patterns 228 in the dummy pattern region 302 and the total area not covered by the dummy patterns 228 in the dummy pattern region 302 is in a range of 40%-90%. In some embodiments, the geometric dimension of the 16 dummy patterns 228 each is configured as ±30% of the geometric dimensions of the device patterns 230 in the device region 201. For example, the dummy patterns 228 each has a width (Wd) and a length (Ld) which are ±30% of a width (Wp) and a length (Lp) of polycrystalline silicon device patterns 230 in the device region 201. In some embodiments, the geometric dimensions of the dummy patterns 228 in the dummy pattern region 302 are identical.

Plots 308 and 309 in FIG. 3A illustrate exemplary relationships between a resistance variation of polycrystalline silicon device patterns 230 in the device region 201 and their corresponding positions along A-A' and B-B' lines, respectively. In some embodiments, the resistance variation (Y-axis) is determined by $(R-R_{ave})/R_{ave}$, wherein R is a resistance value of a polycrystalline silicon device pattern 230 at a position X on the cross-sectional lines and $R_{ave}$ is an average resistance value of polycrystalline silicon device patterns 230 in the device region 201. As discussed above, polycrystalline silicon device patterns 230 in the device region 201 have higher resistance values (R) at locations closer to the edges of the device region 201 due to higher oxide ratio on the area outside the device region 201 which contribute to the local difference in thermal reflectivity. In some embodiments, the resistance and the resistance variation of the polycrystalline silicon device patterns 230 both increase from the center ("O") of the device region 201 to the edges (A/A'), as shown in plot 308. According to the position where the resistance of the polycrystalline silicon device patterns 230 in the device region 201 that needs to be adjusted, the dummy layout patterns can be added to the mask and thus dummy patterns 228 can be fabricated accordingly. For example, referring to FIG. 3A, since the polycrystalline silicon dummy patterns 228 are only fabricated at the lower side to the device region 201 on the oxide layer 216, dummy layout patterns are only added at the respective position on the mask. The resistance values of the polycrystalline silicon device patterns 230 in the device region 201 close to the dummy patterns 228 can be adjusted. Specifically, resistance values and resistance variation of polycrystalline silicon device patterns 230 in the device region 201 are reduced as their positions getting closer to the dummy patterns 228 (B'), as shown plot 309.

FIG. 3B illustrates an exemplary top view of a semiconductor device 310 with 54 dummy patterns 228 at lower and right sides of a device region 201 and position-dependent resistance variations of polycrystalline silicon device patterns 230 in the device region 201 along A-A' and B-B' lines, in accordance with some embodiments of the present disclosure. In the illustrated embodiment, lines A-A' and B-B' are center lines crossing each other at the center of the device region 201. In some embodiments, the dummy patterns 228 in dummy pattern regions 302, 312 and 318 are uniformly distributed. The dummy pattern region 302 has a width 304, which is equal to or greater than ½ of a width 306 of the device region 201, according to certain embodiments. The dummy pattern region 312 has a width of 314, which is equal to or greater than ½ of a width 316 of the device region 201. In some embodiments, the area of the dummy pattern region 318 is defined by the width 304 and 314. In some embodiments, a ratio between the total area covered by the dummy patterns 228 in the dummy pattern region 302, 312 and 318 and the total area not covered by the dummy patterns 228 n the dummy pattern region 302, 312, and 318 is in a range of 40%-90%. In some embodiments, the geometry of the 54 dummy patterns 228 each is configured as ±30% of the geometric dimension of the polycrystalline silicon device patterns 230 in the device region 201. For example, the dummy patterns 228 each has a width (Wd) and a length (Ld) which are ±30% of a width (Wp) and a length (Lp) of polycrystalline silicon device patterns 230 in the device region 201. In some embodiments, the geometric dimensions of the dummy patterns 228 in the dummy pattern regions 302/312/318 are identical.

Plots 318 and 319 in FIG. 3B illustrate position-dependent resistance variations of polycrystalline silicon device patterns 230 in the device region 201 along A-A' and B-B' lines, respectively. According to the position where the resistance of the polycrystalline silicon device patterns 230 in the device region 201 that needs to be adjusted, the dummy patterns 228 can be added accordingly. For example, referring to FIG. 3B, since the polycrystalline silicon dummy patterns 228 are added in the dummy pattern region 302, 312 and 318 at the lower and right sides of the device region 201 on the oxide layer 216, the resistance values of the polycrystalline silicon patterns 230 in the device region 201 close to the dummy pattern regions 302/312/318 can be adjusted. As shown in plots 318 and 319, resistance variations (as shown solid lines) at positions A and B are greater than 10%. As the polycrystalline silicon patterns move from B and A to the center O of the device region 201, the resistance variation reduces to 0%, since the polycrystalline silicon patters 203 at the center of the device layout region 201 are further away from the oxide-rich regions compared to the polycrystalline silicon patters 203 at the edge of the device layout region 201. As the polycrystalline silicon patters 230 moving from the center O to position B' and A', the resistance variation remains constantly around 0%, due to the addition of polycrystalline silicon dummy patterns 228.

FIG. 3C illustrates an exemplary top view of a semiconductor device 320 with 114 dummy patterns 228 around a device region 201 and position-dependent resistance variations of device patterns 230 in the device region 201 along A-A' and B-B' lines, in accordance with some embodiments of the present disclosure. In the illustrated embodiment, lines A-A' and B-B' are center lines crossing each other at the center of the device region 201. In some embodiments, the dummy patterns 228 in dummy pattern regions 302, 312, 318, 322 and 324 are uniformly distributed. In some embodiments, the dummy patterns 228 are polycrystalline silicon dummy patterns. The dummy pattern regions 302 and 322 each have a width 304, which is equal to or greater than ½ of a width 306 of the device layout region 201, according to certain embodiments. The dummy pattern regions 312 and 324 each has a width of 314, which is equal to or greater than ½ of the width 316 of the device layout region 201. In some embodiments, a ration between the total area covered by the dummy patterns 228 in the dummy pattern regions 302, 312, 318, 322 and 324 and the total area not covered by the dummy patterns 228 in the dummy pattern regions 302, 312, 318, 322 and 324 is in a range of 40%-90%. In some embodiments, the geometric dimensions of the 114 dummy patterns 228 each is configured as ±30% of the geometric dimension of the polycrystalline silicon pattern 230 in the device region 201. For example, the dummy patterns 228 each has a width (Wd) and a length (Ld) which are ±30% of a width (Wp) and a length (Lp) of polycrystalline silicon device patterns 230 in the device region 201. In some embodiments, the geometric dimensions of the dummy patterns 228 in the dummy pattern regions are identical.

Plots 328 and 329 in FIG. 3C illustrate exemplary relationships between a resistance variation of device patterns 230 and their location on lines A-A' and B-B' in the device region 201, respectively. Since the polycrystalline silicon dummy patterns 228 are added in the dummy pattern regions 302, 312, 318, 322 and 324 around the device region 201, the resistance values of the polycrystalline silicon device patterns 230 in the device region 201 close to the dummy pattern regions 302/312/318/322/324 can be adjusted. As shown in plots 328 and 329, resistance variations (solid lines in FIG. 3C) of device patterns 230 on the center lines A-A' and B-B' of the device region 201 remain relatively constant as oppose to the resistance variations of device patterns 230 on the center lines A-A' and B-B' of the device region 201 without dummy patterns 228 shown in plot 308 of FIG. 3A.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In an embodiment, a method for fabricating a semiconductor device includes: depositing a first dielectric layer on a semiconductor substrate die; patterning a conductive layer on the first dielectric layer to create at least one device region and at least one dummy pattern region, wherein the at least one device region comprises a plurality of first conductive patterns and the at least one dummy pattern region comprises a plurality of second conductive patterns to control intra-die variation.

In another embodiment, a semiconductor device includes: at least one device region; and at least one dummy pattern region, wherein the at least one device region and the at least one dummy pattern region are patterned on a first dielectric layer, wherein the at least one device region comprises a plurality of first conductive patterns and the at least one dummy pattern region comprises a plurality of second conductive patterns to control intra-die variation.

Yet in another embodiment, a method for fabricating a semiconductor device includes: forming at least one conductive feature on a semiconductor substrate die; depositing a first dielectric layer on the semiconductor substrate die; depositing a conductive layer on the first dielectric layer; patterning the conductive layer on the first dielectric layer to create at least one device region and at least one dummy pattern region, wherein the at least one device region comprises a plurality of first conductive patterns and the at least one dummy pattern region comprises a plurality of second conductive patterns to control intra-die variation; and annealing the semiconductor substrate die with the plurality of first conductive patterns in the at least one device region and the plurality of second conductive patterns in the at least one dummy pattern region.

What is claimed is:

1. A method for fabricating a semiconductor device comprising:
    depositing a first dielectric layer on a semiconductor substrate die;
    patterning a conductive layer on the first dielectric layer to create at least one device region and at least one dummy pattern region, wherein the at least one device region comprises a plurality of first conductive patterns and the at least one dummy pattern region comprises a plurality of second conductive patterns to control intra-die variation, wherein a ratio between a first area and a second area in the at least one dummy pattern region is 40-90%, and wherein the first area is a total area of the first dielectric layer covered by the plurality of second conductive patterns and the second area is a total area of the first dielectric layer without the plurality of second conductive patterns; and
    annealing the plurality of first conductive patterns in the at least one device region and the plurality of second conductive patterns in the at least one dummy pattern region, wherein a variation of resistance values of the plurality of first conductive patterns in the at least one device region after annealing is in a range of ±10%.

2. The method of claim 1, wherein the conductive layer comprises polycrystalline silicon.

3. The method of claim 1, wherein the at least one dummy pattern region is outside of the at least one device region.

4. The method of claim 1, wherein the at least one dummy pattern region each has a first width, wherein the first width of the at least one dummy pattern region is at least half of a second width of the at least one device region.

5. The method of claim 1, wherein the plurality of second conductive patterns in the at least one dummy pattern region each comprises a first geometric dimension, wherein the first geometric dimension is ±30% of a second geometric dimension of the plurality of first conductive patterns in the at least one device region.

6. The method of claim 1 further comprising:
    patterning a first photoresist layer on the first dielectric layer;
    etching the first dielectric layer; and
    forming at least one conductive feature on the semiconductor substrate die.

7. The method of claim 1 further comprising:
    growing a second dielectric layer on the semiconductor substrate die; and depositing the conductive layer on the semiconductor substrate die.

8. A semiconductor device comprising:
at least one device region; and
at least one dummy pattern region,
wherein the at least one device region and the at least one dummy pattern region are patterned on a first dielectric layer on a semiconductor substrate die, wherein the at least one device region comprises a plurality of first conductive patterns and the at least one dummy pattern region comprises a plurality of second conductive patterns to control intra-die variation, wherein a ratio between a first area and a second area in the at least one dummy pattern region is 40-90%, and wherein the first area is a total area of the first dielectric layer covered by the plurality of second conductive patterns and the second area is a total area of the first dielectric layer without the plurality of second conductive patterns, and wherein a variation of resistance values of the plurality of first conductive patterns in the at least one device region is in a range of ±10%.

9. The device of claim 8, wherein the conductive layer comprises polycrystalline silicon.

10. The device of claim 8, wherein the at least one dummy pattern region is outside of the at least one device region.

11. The device of claim 8, wherein the dummy pattern region has a first width, wherein the first width of the dummy pattern region is at least half of a second width of the device region.

12. The device of claim 8, wherein the plurality of second conductive patterns in the at least one dummy pattern region each comprises a first geometric dimension, wherein the first geometric dimension is ±30% of a second geometric dimension of the plurality of first conductive patterns in the at least one device region.

13. The device of claim 8, further comprising
at least one conductive feature in the semiconductor substrate die; and
at least one shallow trench isolation structure in the semiconductor substrate die.

14. A method for fabricating a semiconductor device comprising:
forming at least one conductive feature on a semiconductor substrate die;
depositing a first dielectric layer on the semiconductor substrate die;
depositing a conductive layer on the first dielectric layer;
patterning the conductive layer on the first dielectric layer to create at least one device region and at least one dummy pattern region, wherein the at least one device region comprises a plurality of first conductive patterns and the at least one dummy pattern region comprises a plurality of second conductive patterns to control intra-die variation; and
annealing the semiconductor substrate die with the plurality of first conductive patterns in the at least one device region and the plurality of second conductive patterns in the at least one dummy pattern region,
wherein a ratio between a first area and a second area in the at least one dummy pattern region is 40-90%, wherein the first area is a total area of the first dielectric layer covered by the plurality of second conductive patterns and the second area is a total area of the first dielectric layer without the plurality of second conductive patterns, and wherein a variation of resistance values of the plurality of first conductive patterns in the at least one device region after annealing is in a range of ±10%.

15. The method of claim 14, wherein the at least one dummy pattern region is outside of the at least one device region.

16. The method of claim 14, wherein the at least one dummy pattern region has a first width, wherein the first width of the at least one dummy pattern region is at least half of a second width of the at least one device region.

17. The method of claim 14, wherein the plurality of second conductive patterns in the at least one dummy pattern region each comprises a first geometric dimension, wherein the first geometric dimension is ±30% of a second geometric dimension of the plurality of first conductive patterns in the at least one device region.

18. The method of claim 14, wherein the conductive layer comprises polycrystalline silicon.

19. The method of claim 14, wherein the forming further comprises:
patterning a first photoresist layer on the first dielectric layer; and
etching the first dielectric layer.

20. The method of claim 14, wherein the patterning further comprises:
patterning a first photoresist layer on the conductive layer; and
etching the conductive layer.

* * * * *